(12) United States Patent
Winer

(10) Patent No.: US 11,519,944 B2
(45) Date of Patent: Dec. 6, 2022

(54) VOLTAGE DIFFERENTIAL SENSING CIRCUITS

(71) Applicant: Hamilton Sundstrand Corporation, Charlotte, NC (US)

(72) Inventor: Gordon Elliott Winer, Prescott, AZ (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 60 days.

(21) Appl. No.: 17/119,919

(22) Filed: Dec. 11, 2020

(65) Prior Publication Data
US 2022/0187345 A1 Jun. 16, 2022

(51) Int. Cl.
*G01R 19/10* (2006.01)
(52) U.S. Cl.
CPC .................... *G01R 19/10* (2013.01)
(58) Field of Classification Search
CPC ....... H03F 2203/45288; H03F 2200/81; H03F 2200/375; H03F 2200/27; H03F 2200/264; H03F 2200/261; H03F 2200/294; H03F 2203/45564; H03F 2203/45594; H03F 2203/45026; H03F 2203/45138; H03F 2200/516; H03F 2203/45018; H03F 3/211; H03F 2200/135; H03F 2200/129; H03F 3/387; H03F 3/45475; H03F 2200/312; H03F 2200/372; H03F 2203/45596; H03F 3/3077; H03F 1/0244; H03F 1/305; H03F 2203/30078; H03F 2203/30111; H03F 2203/45566; H03F 3/3018; H03F 3/42; H03F 3/4517; H03F 1/523; H03F 3/505; H03F 3/087; G01R 33/07; G01R 19/16542; G01R 27/08; G01R 31/396; G01R 1/28; G01R 1/30; G01R 1/36; G01R 15/04; G01R 19/00; H02J 7/0047; H02J 7/1461; H02J 7/16; H02J 2300/26; H02J 7/00308; H02J 7/00309; H02J 7/007192; H02J 7/007182; H02J 7/0086; H02J 9/06; G01K 1/024; H01L 27/0623; H01L 21/8249;
(Continued)

(56) References Cited

U.S. PATENT DOCUMENTS

| 3,311,907 A | 3/1967 | Teal |
| 5,121,108 A | 6/1992 | Schemmel |
| 5,146,397 A | 9/1992 | Fruhling |

(Continued)

FOREIGN PATENT DOCUMENTS

| FR | 2280905 A2 | 2/1976 |
| FR | 2318426 A2 | 2/1977 |

OTHER PUBLICATIONS

Extended European Search Report issued by Examiner Thomas Agergaek, of the European Patent Office, dated May 9, 2022, in corresponding European Patent Application No. 21213894.5.

*Primary Examiner* — Vinh P Nguyen
(74) *Attorney, Agent, or Firm* — Locke Lord LLP; Daniel J. Fiorello; Gabrielle L. Gelozin

(57) ABSTRACT

A voltage differential testing circuit can include a first positive line configured to connect to a positive voltage source, and a first negative line configured to connect to a negative voltage source. The circuit can include a plurality of components arranged and configured to output an output voltage when a voltage differential between a positive voltage line and a negative voltage line is within a voltage range.

15 Claims, 13 Drawing Sheets

(58) Field of Classification Search
CPC . H01L 23/34; H01L 27/0248; H01L 27/0635; H01L 2924/0002; H03G 1/0082
See application file for complete search history.

(56) References Cited

U.S. PATENT DOCUMENTS

| | | | |
|---|---|---|---|
| 5,444,361 A * | 8/1995 | Ryat | H03F 3/343 |
| | | | 323/315 |
| 5,541,500 A | 7/1996 | Krahl | |
| 5,614,807 A | 3/1997 | Duley | |
| 5,642,076 A * | 6/1997 | Naokawa | H03F 1/305 |
| | | | 381/94.8 |
| 5,933,010 A | 8/1999 | Moreno | |
| 6,686,782 B2 * | 2/2004 | Kinoshita | H03K 17/223 |
| | | | 327/143 |
| 7,936,085 B2 | 5/2011 | Vandergrift | |
| 8,896,349 B2 | 11/2014 | Vilas Boas et al. | |
| 9,466,337 B1 | 10/2016 | Pan | |
| 10,094,859 B1 | 10/2018 | Rao et al. | |
| 10,236,842 B2 | 3/2019 | Michal et al. | |
| 10,284,190 B2 | 5/2019 | Tsai et al. | |
| 2009/0168283 A1 | 7/2009 | Hsieh | |
| 2011/0210758 A1* | 9/2011 | Zhang | G01R 19/16552 |
| | | | 324/705 |
| 2016/0062383 A1 | 3/2016 | Nagasawa | |

* cited by examiner

VOLTAGE DIFFERENTIAL SENSING CIRCUITS

FIELD

This disclosure relates to electrical circuits, e.g., for sensing a voltage differential.

BACKGROUND

Certain systems can have a positive and negative rail (e.g., equal and opposite voltages). Power supply from either or both rails, for example, can fluctuate from a nominal value and can fall below of a desired or necessary voltage to operate a load.

Conventional methods and systems have generally been considered satisfactory for their intended purpose. However, there is still a need in the art for voltage differential sensing circuits. The present disclosure provides a solution for this need.

SUMMARY

A voltage differential testing circuit can include a first positive line configured to connect to a positive voltage source, and a first negative line configured to connect to a negative voltage source. The circuit can include a plurality of components arranged and configured to output an output voltage when a voltage differential between a positive voltage line and a negative voltage line is within a voltage range.

In certain embodiments, the positive voltage line can be connected to a +15 VDC rail, and the negative voltage leg can be connected to a −15 VDC rail. The plurality of components can be configured to output the output voltage when the differential between the positive voltage line and the negative voltage line is about 25 VDC or greater in a temperature operating range of about −55 C to about 125 C. Any other suitable range is contemplated herein.

The plurality of components include a Darlington pair transistor assembly having a first transistor (Q1) and a second transistor (Q2) arranged in a Darlington pair configuration. A first base of the first transistor is connected to the first positive line. A second base of the second transistor can be connected to a first emitter of the first transistor.

A first collector of the first transistor and a second collector of the second transistor can be connected to in parallel to a second positive line. A second emitter of the second transistor can be connected to the first negative line.

The plurality of components can include a third transistor (Q3) having a third base connected in parallel to the collectors of the first and second transistors. A third emitter of the third transistor can be connected to a third positive line. A third collector of the third transistor can be connected to a voltage out line. In certain embodiments, the first and second transistors can be npn transistors and the third transistor can be a pnp transistor.

The plurality of components can include a first emitter resistor having a first resistance (R1) and connected between the first emitter and the first negative line such that the first emitter resistor is connected in parallel with the second base to the first emitter and in parallel with the second emitter to the negative line. The plurality of components can include a negative line resistor having a negative line resistance (R2) and disposed on the first negative line between a first emitter resistor point where the first emitter resistor connects and the negative voltage source.

The plurality of components can include a third resistor having a third resistance (R3) and disposed between the first base of the first transistor and a point between the first emitter and the first emitter resistor. The plurality of components can include a ground resistor having a fourth resistance (R4) disposed between the third collector and ground, and in parallel to the third collector with the voltage out line. The plurality of components can include a second positive line resistor having a fifth resistance (R5) and disposed on the second positive line before a first collector point connecting the second positive line to the first collector.

The plurality of components can include a first positive line resistor having a positive line resistance (R9) and disposed on the first positive line between the first base and the positive voltage source. A third resistor point where the third resistor connects to the first positive line can be between the first positive line resistor and the first base.

The plurality of components can include a crossover resistor having a crossover resistance (R7) and disposed between the first positive line and the first negative line. The crossover resistor can be electrically connected to a positive crossover point that is between the third resistor point and the first positive line resistor. The crossover resistor can be electrically connected to the negative line at a negative crossover point that is between the negative line resistor and the first resistor point.

In certain embodiments, the plurality of components include a first Zener diode disposed on the negative line between the negative line resistor and the negative voltage source, and a second Zener diode disposed on the first positive line between the first positive line resistor and the positive voltage source. The first and second Zener diodes can be oriented and configured to allow respective current flow on each line above a breakdown voltage.

In certain embodiments, the second positive line and the third positive line are connected to the first positive line or to the positive voltage source to have the same voltage. In certain embodiments, R4 is the highest resistance, R7 is the lower than R4, R3 is lower than R7, R2 and R9 are lower than R3, and R1 and R5 are lower than R2 and R9. For example, in certain embodiments, R4 is about 100 k ohms, R7 is about 70 k ohms, R3 is about 10 k ohms, R2 and R9 are about 4K ohms, and R1 and R5 are about 1 k ohms. Any other suitable relative values and/or absolute values are contemplated herein, as long as the desired function of the circuit is achieved (e.g., with nothing more than the components described herein).

In certain embodiments, the plurality of components include the resistors described above without the first emitter resistor and the third resistor. For example, in certain embodiments, R4 can be the highest resistance, R7 can be lower than R4, R2 and R9 can be lower than R7, and R5 can be lower than R2 and R9. In certain embodiments, R7 can be between about 10 k ohms and 1 megaohm.

In accordance with at least one aspect of this disclosure, a circuit can include means for outputting an output voltage when a voltage differential between a positive voltage line and a negative voltage line is within a voltage range. For example, a circuit can be a circuit as shown in the figures (e.g., with or without the stated resistor values).

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
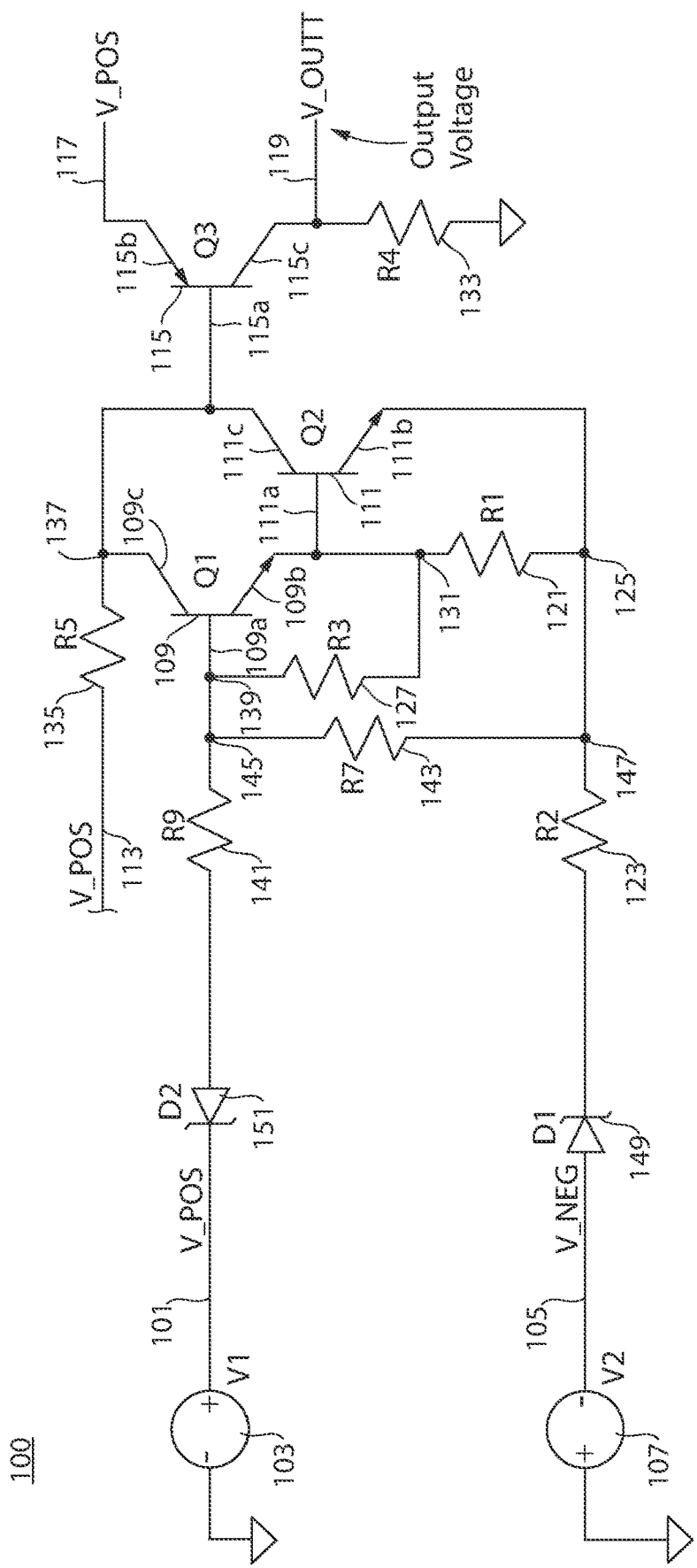
FIG. 1 is a circuit diagram of an embodiment of a circuit in accordance with this disclosure.

Reference will now be made to the drawings wherein like reference numerals identify similar structural features or aspects of the subject disclosure. For purposes of explanation and illustration, and not limitation, an illustrative view of an embodiment of a circuit in accordance with the disclosure is shown in FIG. 1 and is designated generally by reference character 100. Other embodiments and/or aspects of this disclosure are shown in FIGS. 2-8.

Referring to FIG. 1, a voltage differential testing circuit 100 can include a first positive line 101 configured to connect to a positive voltage source 103, and a first negative line 105 configured to connect to a negative voltage source 107. The circuit 100 can include a plurality of components (e.g., the resistors, transistors, and diodes as shown in the figures) arranged and configured (e.g., as shown in the figures) to output an output voltage when a voltage differential between a positive voltage line and a negative voltage line is within a voltage range (e.g., within about 25V to about 30V, for example).

Figure 1A:
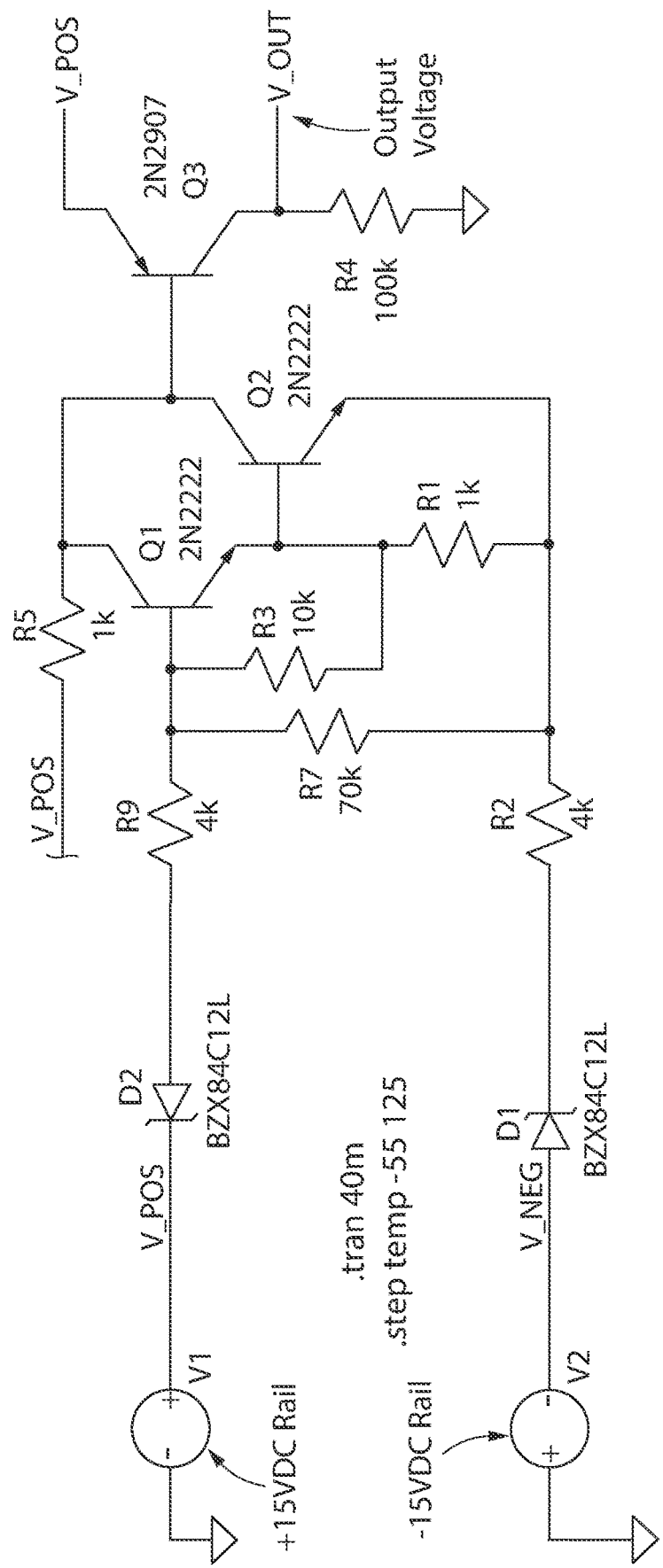
FIG. 1A is a circuit diagram of the embodiment of FIG. 1, showing an embodiment of resistance values.

In certain embodiments, for example, referring to the embodiment of FIG. 1A, the positive voltage line 101 can be connected to a +15 VDC rail (e.g., a positive 15V voltage source), and the negative voltage leg 105 can be connected to a negative 15 VDC rail (e.g., a negative 15V voltage source). The plurality of components can be configured to output the output voltage when the differential between the positive voltage line and the negative voltage line is about 25 VDC or greater in a temperature operating range of about −55 C to about 125 C. Any other suitable range is contemplated herein.

The plurality of components can include a Darlington pair transistor assembly having a first transistor 109 (Q1) and a second transistor 111 (Q2) arranged in a Darlington pair configuration (e.g., as appreciated by those having ordinary skill in the art). A first base 109a of the first transistor can be connected to the first positive line 101 (e.g., in series through a resistor and diode as shown). A second base 111a of the second transistor 111 can be connected to a first emitter 109b of the first transistor 109.

A first collector 109c of the first transistor 109 and a second collector 111c of the second transistor 111 can be connected to in parallel to a second positive line 113 (e.g., which can be connected to the first positive line 101 to see the same voltage, for example). A second emitter 111b of the second transistor 111 can be connected to the first negative line 105 (e.g., in series through a resistor and diode as shown).

The plurality of components can include a third transistor 115 (Q3) having a third base 115a connected in parallel to the collectors 109c, 111c of the first and second transistors 109, 111 (e.g., as shown). A third emitter 115b of the third transistor can be connected to a third positive line 117 (e.g., which can be connected to the first positive line 101 to see the same voltage, for example). A third collector 115c of the third transistor 115 can be connected to a voltage out line 119.

In certain embodiments, the first and second transistors 109, 111 can be npn transistors and the third transistor 117 can be a pnp transistor (e.g., as shown). Any other suitable types of transistors and/or arrangement configured to perform similarly or otherwise suitably are contemplated herein.

The plurality of components can include a first emitter resistor 121 having a first resistance (R1) and connected between the first emitter 109b and the first negative line 109 such that the first emitter resistor 121 is connected in parallel with the second base 111a to the first emitter 109b and in parallel with the second emitter 111b to the negative line 105. The plurality of components can include a negative line resistor 123 having a negative line resistance (R2) and disposed on the first negative line 105 between a first emitter resistor point 125 where the first emitter resistor 121 connects and the negative voltage source 107.

The plurality of components can include a third resistor 127 having a third resistance (R3) and disposed between the first base 109a of the first transistor 109 and a point 131 between the first emitter 109b and the first emitter resistor 121. The plurality of components can include a ground resistor 133 having a fourth resistance (R4) disposed between the third collector 115c and ground, and in parallel to the third collector 115c with the voltage out line 119. The plurality of components can include a second positive line resistor 135 having a fifth resistance (R5) and disposed on the second positive line 113 before a first collector point 137 connecting the second positive line 113 to the first collector 109c.

The plurality of components can include a first positive line resistor 141 having a positive line resistance (R9) and disposed on the first positive line 101 between the first base 109a and the positive voltage source 103. A third resistor point 139 where the third resistor 127 connects to the first positive line 101 can be between the first positive line resistor 141 and the first base 109a.

The plurality of components can include a crossover resistor 143 having a crossover resistance (R7) and disposed between the first positive line 101 and the first negative line 105. The crossover resistor 143 can be electrically connected to a positive crossover point 145 that is between the third resistor point 139 and the first positive line resistor 141. The crossover resistor 143 can be electrically connected to the negative line 105 at a negative crossover point 147 that is between the negative line resistor 123 and the first resistor point 125.

In certain embodiments, the plurality of components include a first Zener diode 149 disposed on the negative line 105 between the negative line resistor 123 and the negative voltage source 107, and a second Zener diode 151 disposed on the first positive line 101 between the first positive line resistor 141 and the positive voltage source 103. The first and second Zener diodes 149, 151 can be oriented and configured to allow respective current flow on each line 101, 105 above a breakdown voltage (e.g., 12V or any other suitable voltage).

In certain embodiments, the second positive line 113 and the third positive line 117 can be connected to the first positive line 101 or to the positive voltage source 103 to have the same voltage as the first positive line 101 (e.g., as shown in FIGS. 1 and 1A). In certain embodiments, R4 is the highest resistance, R7 is the lower than R4, R3 is lower than R7, R2 and R9 are lower than R3, and R1 and R5 are lower than R2 and R9. For example, in certain embodiments, R4 is about 100 k ohms, R7 is about 70 k ohms, R3 is about 10 k ohms, R2 and R9 are about 4K ohms, and R1 and R5 are about 1 k ohms. In certain embodiments, with rails of same but opposite voltage value, R5 must be much less than R4. Any other suitable relative values and/or absolute values are contemplated herein, as long as the desired function of the circuit is achieved (e.g., with nothing more than the components shown in FIGS. 1 and/or 1A, FIGS. 3A, 3B, and/or FIG. 4, for example).

Figure 2:
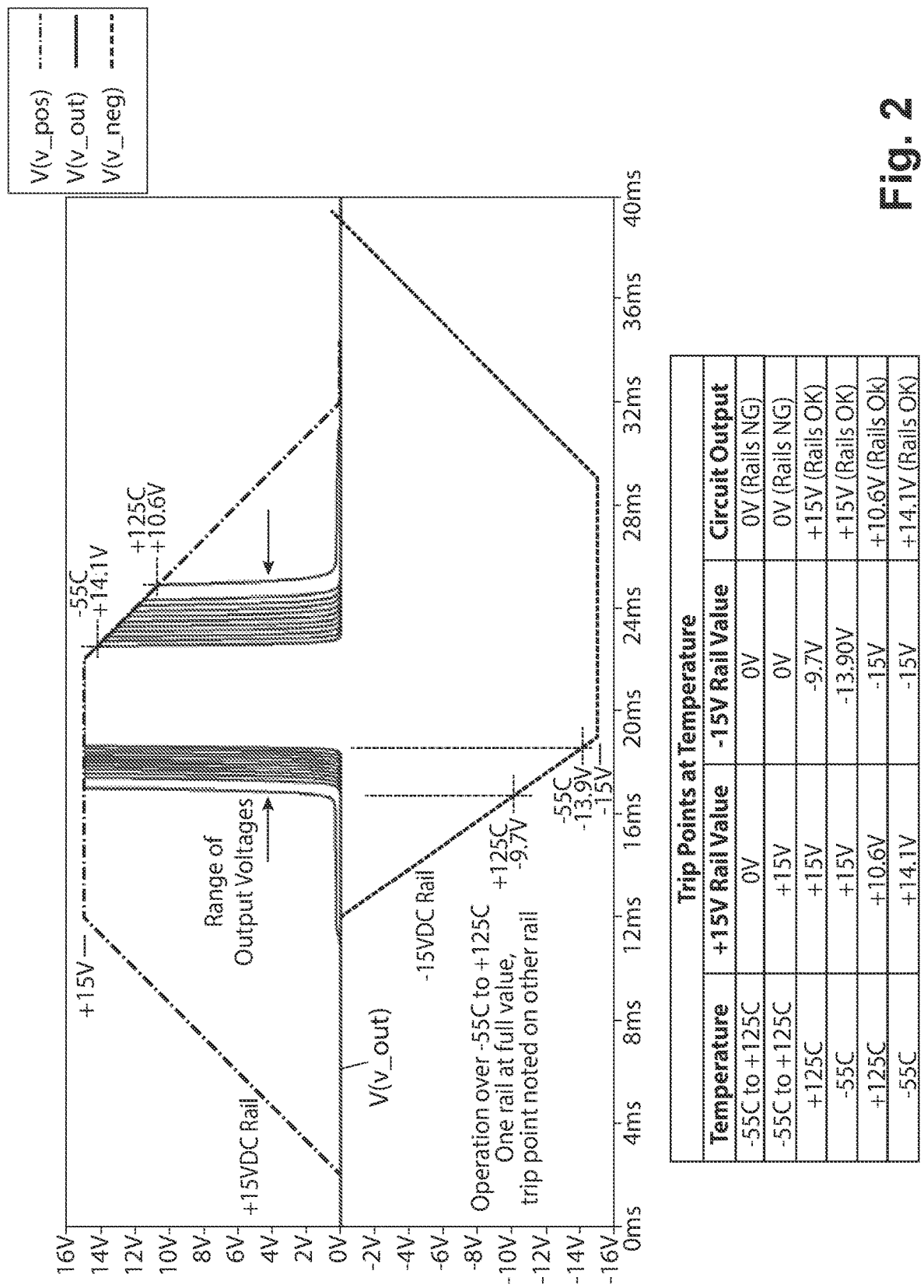
FIG. 2 is a plot showing operation of the embodiment of FIG. 1 over a range of temperatures.

FIG. 2 is a plot showing operation of the embodiment of FIG. 1A over a range of temperatures (e.g., for a 30V nominal differential system). FIG. 2 demonstrates that over a very wide range of temperatures, the circuit 100 will output the output voltage (e.g., about +15V) when the voltage differential is about 25V or higher, ensuring reliable operation and safety of the load using the +/−15V system. As can be seen, output is low until both positive voltage and negative voltage have reached a threshold voltage (which can change with operating temperature as shown). For example, in the shown embodiment, the output voltage goes high at −9.7V+15V at a temperature of 125 C and the output voltage goes high at −13.9V+15V at a temperature of −55 C. For example, in the shown embodiment, the output voltage can return to low at +10.6V-15V at a temperature of 125 C, and the output voltage can return low at +14.1V-15V at a temperature of −55 C.

Figure 3A:
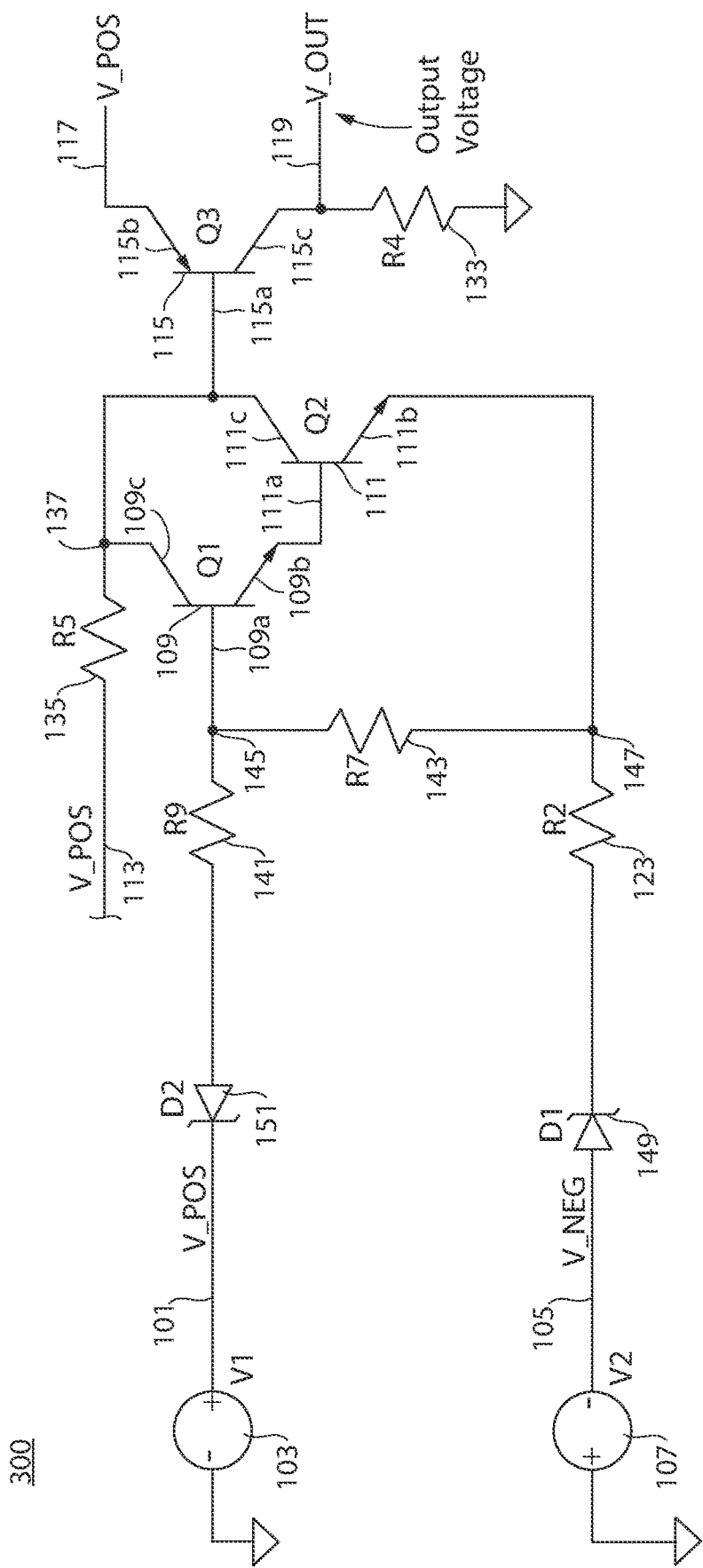
FIG. 3A is a circuit diagram of an embodiment of a circuit in accordance with this disclosure.
Figure 3B:
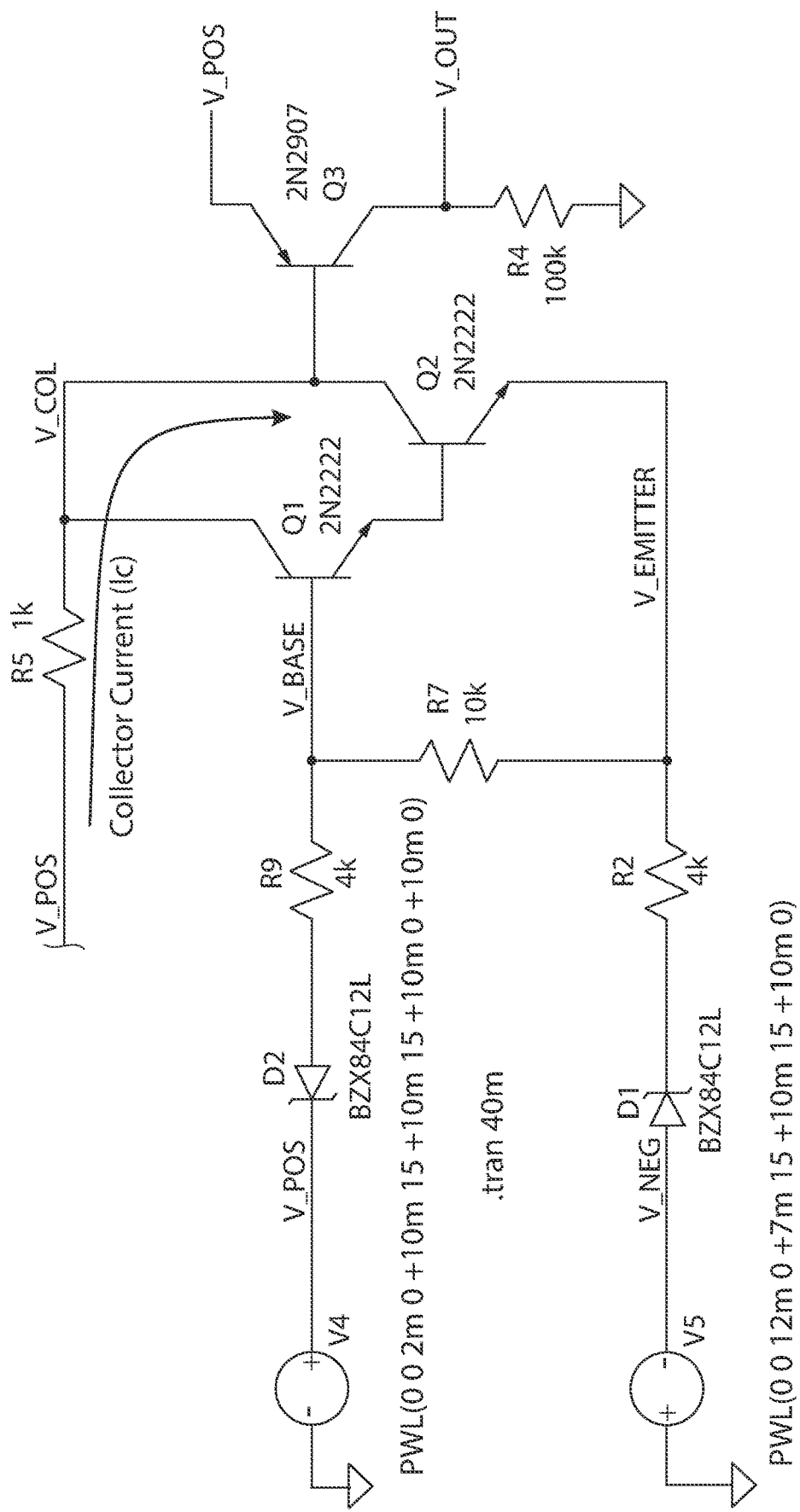
FIG. 3B is a circuit diagram of the embodiment of FIG. 3A, showing an embodiment of resistance values.
Figure 3C:
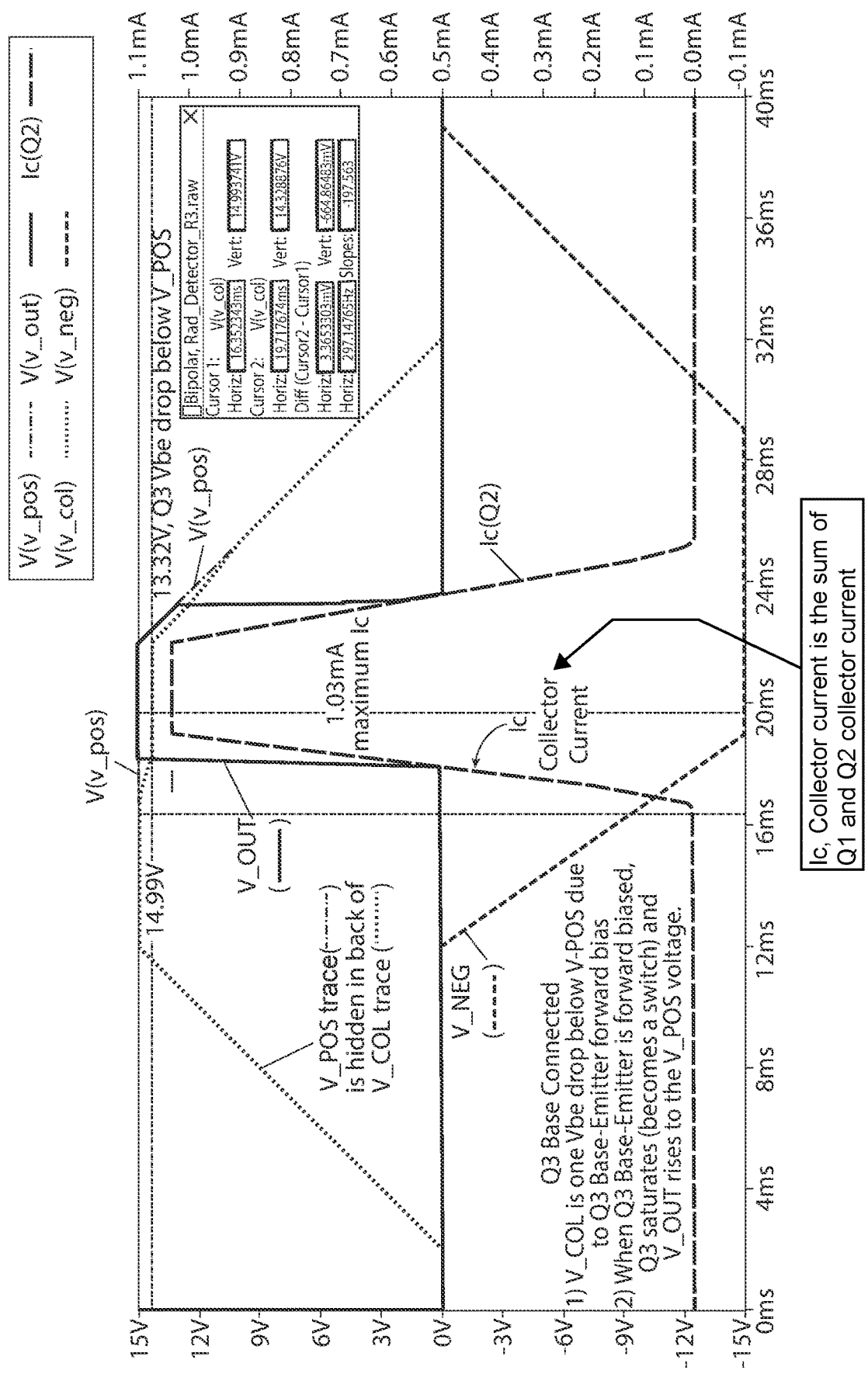
FIG. 3C is a plot indicating the sum of Q1 and Q2 collector current and output voltage as a function of rail voltage of the embodiment of FIG. 3B.

Referring to FIGS. 3A and 3B, for example, in certain embodiments, the plurality of components of an embodiment of a circuit 300 can include the resistors described above without the first emitter resistor and the third resistor. In certain embodiments, the circuit 300 can otherwise be the same circuit as circuit 100. FIG. 3C is a plot indicating Q1/Q2 collector voltage, the sum of Q1 and Q2 collector current, and output voltage as a function of rail voltage of the embodiment of FIG. 3B. The plot shown can reflect circuit behavior when the temperature is 27 C, for example. As shown in the simulated embodiment, V_Pos and V-Neg must have a sufficiently wide differential to break over the Zener diodes and forward bias the junctions on Q1 and Q2. As shown, in certain embodiments, transistors Q1 and Q2 operate in the Forward Active (FA) region which forces current through the second positive line resistor 135 (with resistance R5) and creates a voltage drop across the base-emitter junction of transistor Q3 which causes transistor Q3 to operate as a saturated switch and forces V_OUT to rise to almost the same voltage as V_POS.

Figure 4:
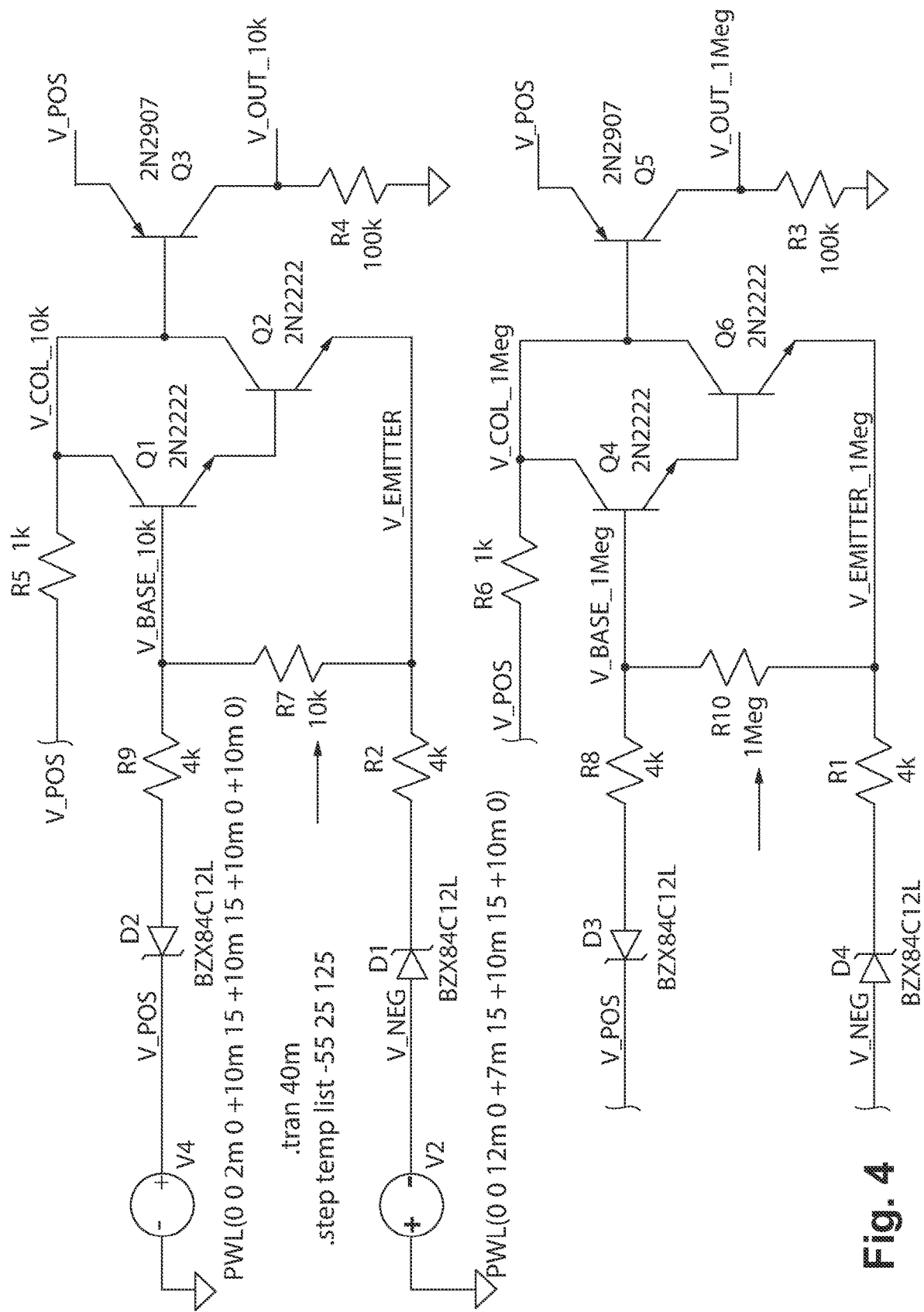
FIG. 4 shows two embodiments of the circuit of FIG. 3B having modified resistance values of R7 in accordance with this disclosure for comparison.
Figure 5A:
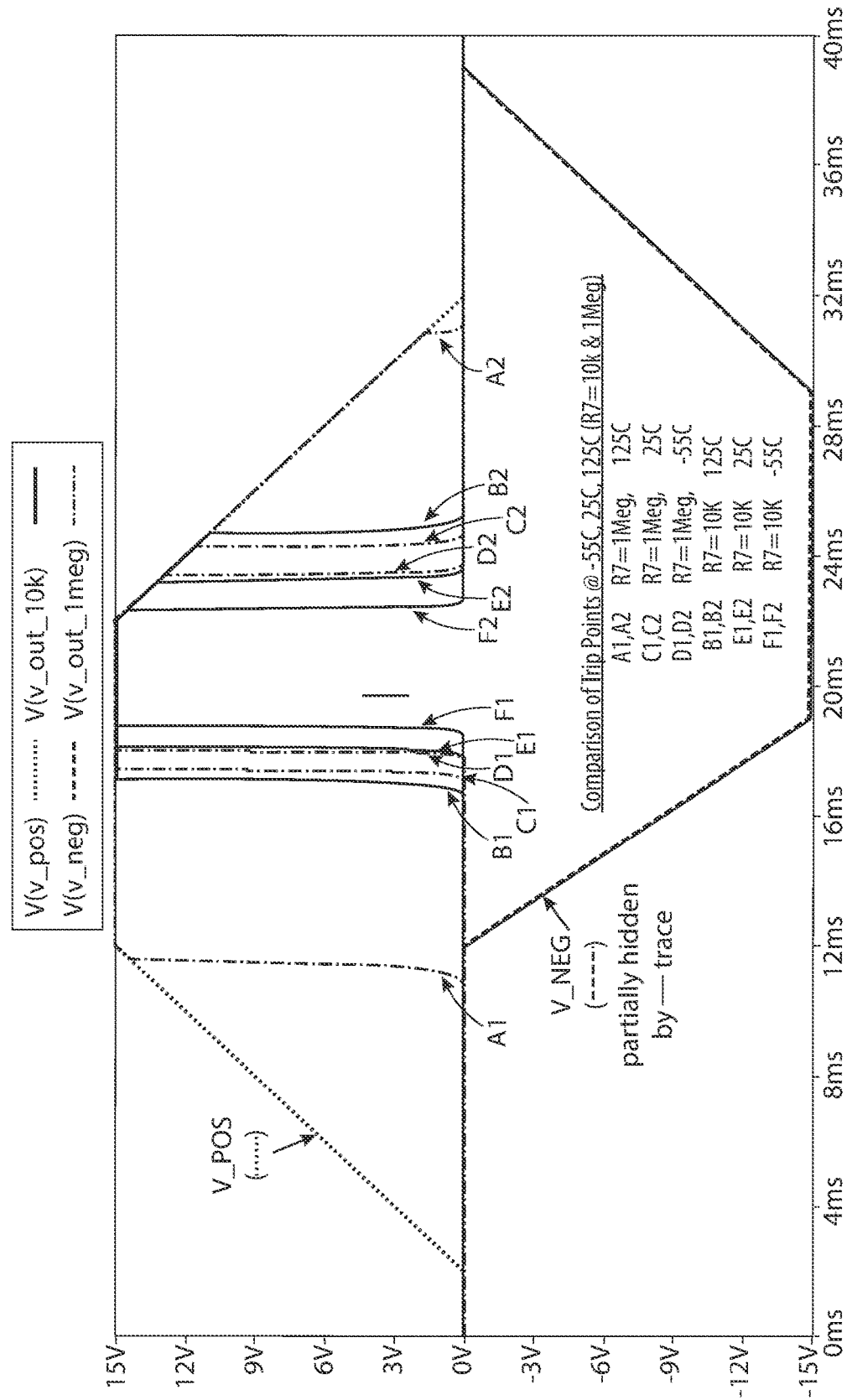
FIG. 5A is a plot showing operation of the embodiments of FIG. 4 over a range of temperatures.
Figure 5B:
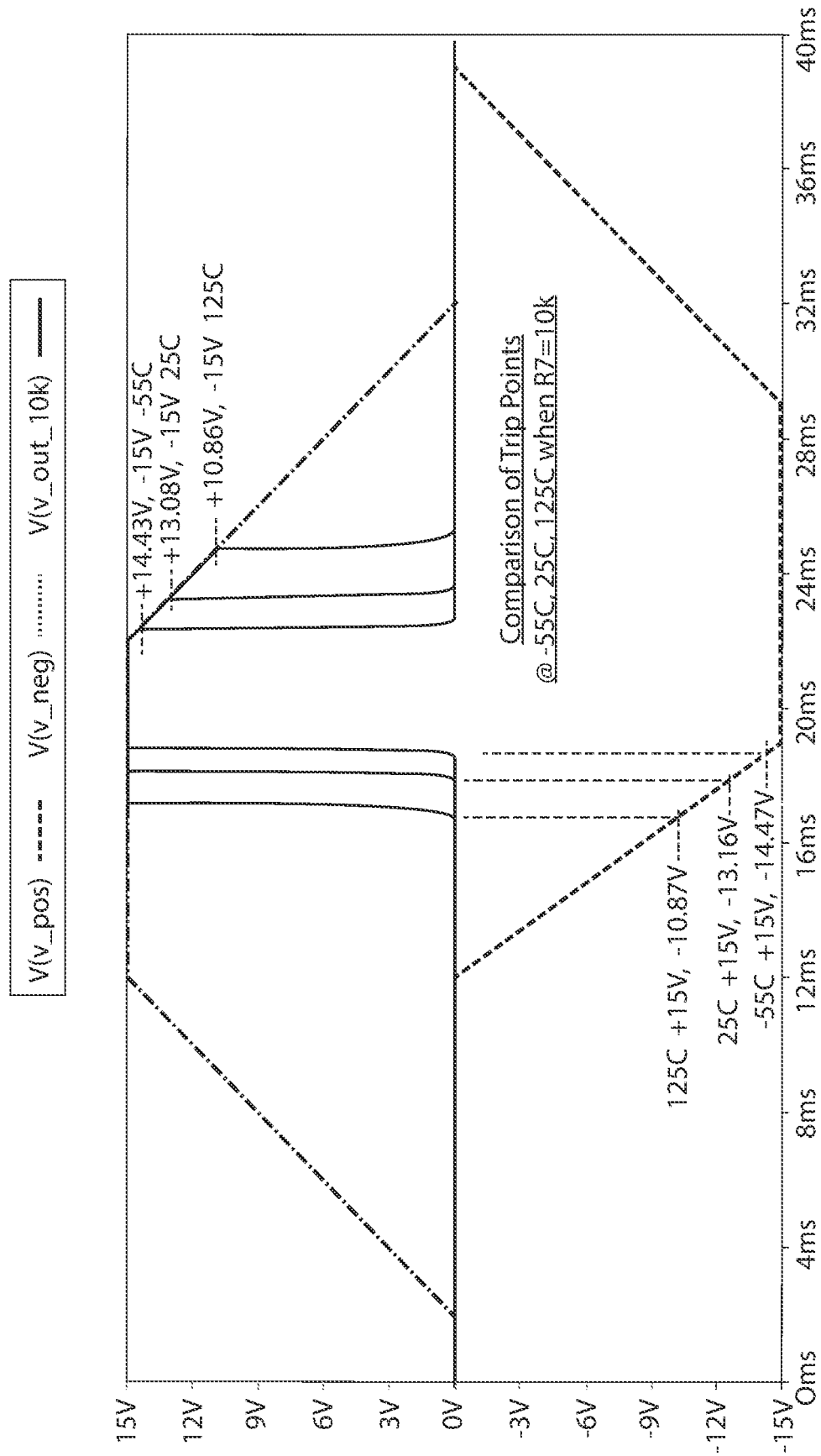
FIG. 5B is a plot showing operation of an embodiment of FIG. 4 over a range of temperatures, showing that with the base-to-emitter resistor R7 set to 10K ohms, the smallest differential voltage that trips the detector is about 24V.
Figure 5C:
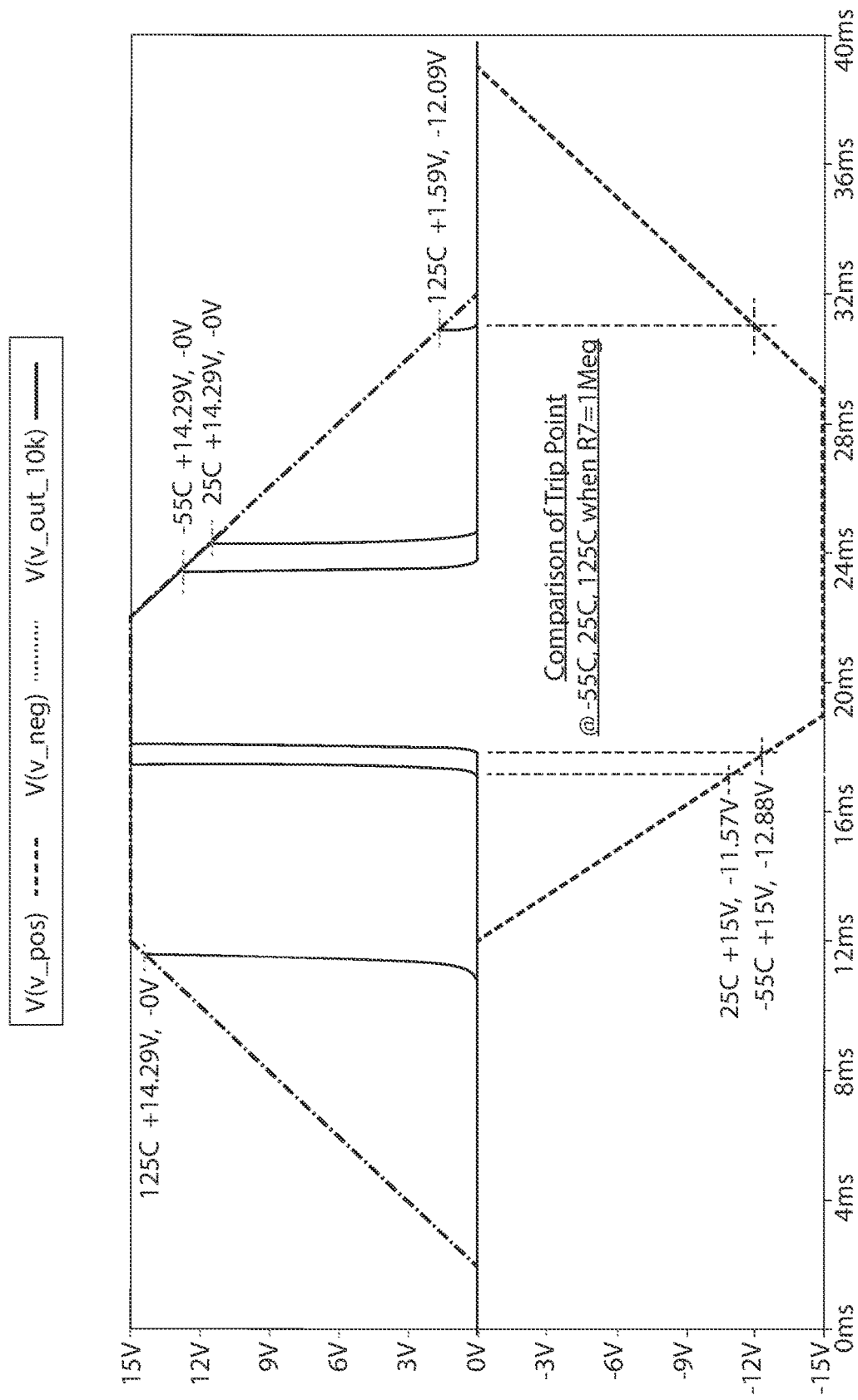
FIG. 5C is a plot showing operation of the other embodiment of FIG. 4 over a range of temperatures, showing that with the base-to-emitter resistor R10 set to 1 Megaohm, the smallest differential voltage that trips the detector is about 14V.

With additional reference to the comparison diagram of FIG. 4, for example, R4 can be the highest resistance, R7 can be lower than R4, R2 and R9 can be lower than R7, and R5 can be lower than R2 and R9. In certain embodiments, R7 can be between about 10 k ohms and 1 megaohm. Any other suitable resistance values for suitable or desirable operation are contemplated herein. FIG. 4 indicates similar circuits with certain different resistance values to show what happens across a temperature range when the base-to-emitter resistor (e.g., R7 in the top circuit, R10 in the bottom circuit) is at 10K and 1 Meg ohms. As shown below, the smallest differential voltage trip point can be about 24V with 10K ohms, but the smallest differential trip point can be about 14V with 1 Meg ohms.

In accordance with at least one aspect of this disclosure, a circuit (e.g., circuit 100 as shown in FIG. 1 or any other circuit disclosed herein) can include means for outputting an output voltage when a voltage differential between a positive voltage line and a negative voltage line is within a voltage range. For example, a circuit can be a circuit as shown in the figures (e.g., with or without the stated resistor values).

In certain embodiments, the circuit may only include 3 transistors, 5 to 7 resistors, and two Zener diodes. Such an embodiment can be extremely small and lightweight while providing reliable operation (e.g., within about a 5V differential of nominal total voltage differential) over an extremely wide temperature range (e.g., negative 55 C to positive 125 C).

Embodiments provide a Darlington pair of transistors, which can provide high gain that allows sufficient current to flow through resistor 135 (R5) to make transistor Q3 base voltage sufficiently lower than V_POS (transistor Q3 emitter voltage) and causing transistor Q3 to go into saturated operating mode where there is a minimal voltage drop from the transistor Q3 emitter to collector. The increase of the transistor Q3 collector voltage indicates that the desired differential voltage is present between V_POS and V_NEG. Embodiments can use the same voltage from the positive rail which can eliminate the need for separate voltage sources. However, different sources are contemplated herein.

In certain embodiments, the transistor Q3 base connection can be open and transistor Q3 can be disconnected from the line labeled "V_COL." "V_POS" can be the positive voltage rail that is being monitored, "V_NEG" can be the negative voltage rail being monitored. The voltage at V_COL WRT (With Respect To) circuit return can equal [V_POS−(Ic× R5)]. So, as Ic rises, V_COL voltage drops further below V_POS.

As the difference between V_POS and V_NEG increases past the D1, D2 Zener breakdown voltage, a voltage is developed across R7 which when large enough will cause Q1, Q2 Darlington configuration to go from cutoff to the forward active mode of operation.

Q1, Q2 provides enough amplification to cause collector current to flow and makes a voltage drop across R5 thus the collector voltage V_COL is below V_POS which causes Q3 to turn on and saturate (saturation=the voltage drop from emitter to collector is very small, Q3 acts like a switch) and allows V_OUT to rise close to the value of V_POS.

When Q3 is turned on it is an indication that the V_POS and V_NEG have reached an acceptable voltage, when Q3 is off it means that the V_POS or V_NEG are below the acceptable voltage.

Several simulations on the circuit of FIGS. 3A and 3B and 4 were performed to demonstrate the effect of modifying certain resistance values versus operating temperature. For example, referring to FIGS. 5A-5C, a simulation was run at −55 C, +25 C, and +125 C with two identical circuits except for the value of R7 being changed between 10K ohms and 1 Meg ohms as shown in FIG. 4. When R7 is large, a smaller difference between V_POS and V_NEG is needed to achieve sufficient Base-Emitter voltage at the Darlington pair to cause collector current to flow. A difference in trip point due to change of Base-Emitter forward voltage (Vbe) with temperature is shown to be about −2 mV/degree C. Higher temperatures allows less Vbe to forward bias the Base-Emitter junction, so less difference between V_POS and V_NEG is needed at higher temperatures.

Figure 6:
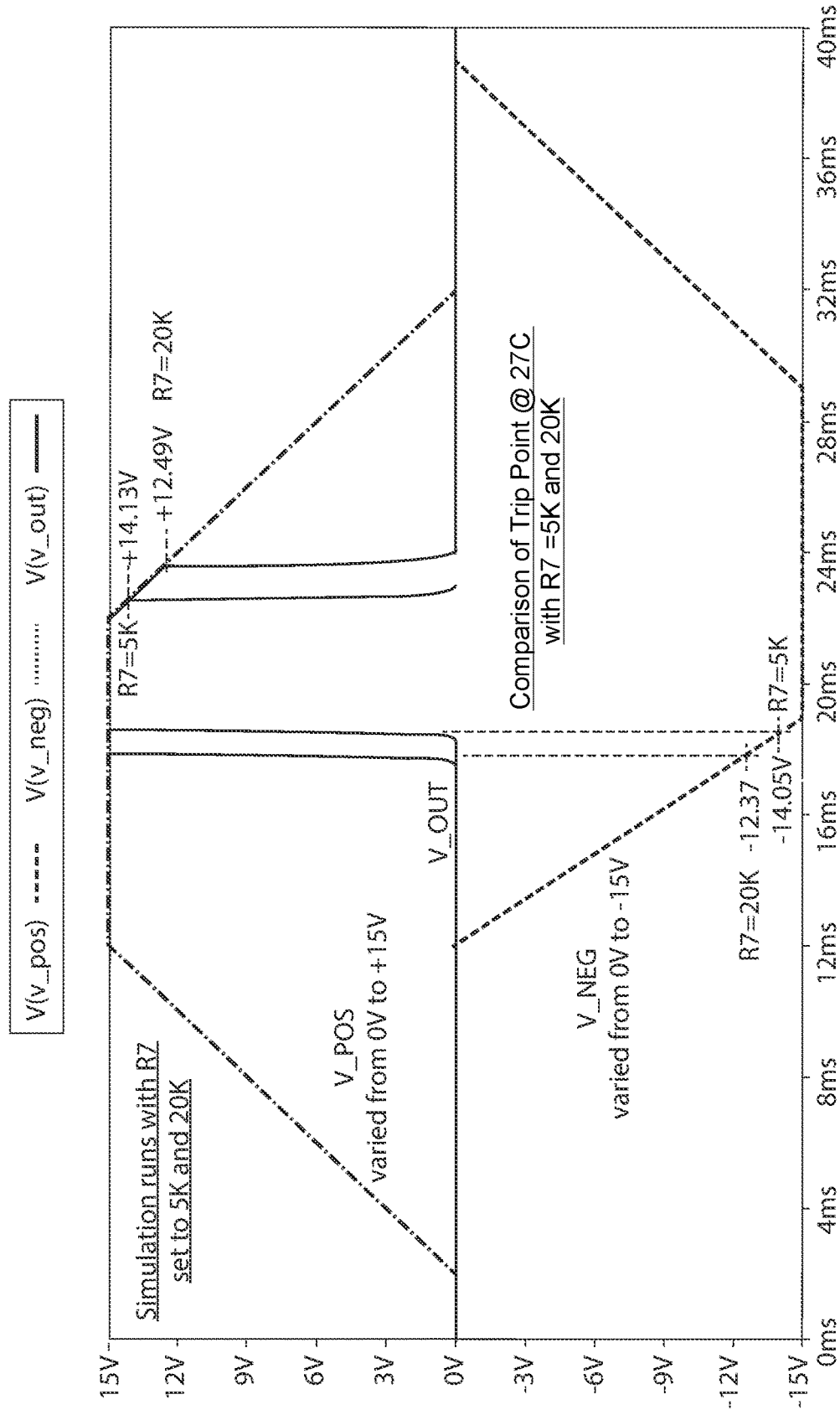
FIG. 6 is a plot showing operation of the embodiment of FIG. 3B, except shown having R7 set to 5K ohms and 20K ohms for comparison (simulated at a temperature of 27 C)
Figure 7:
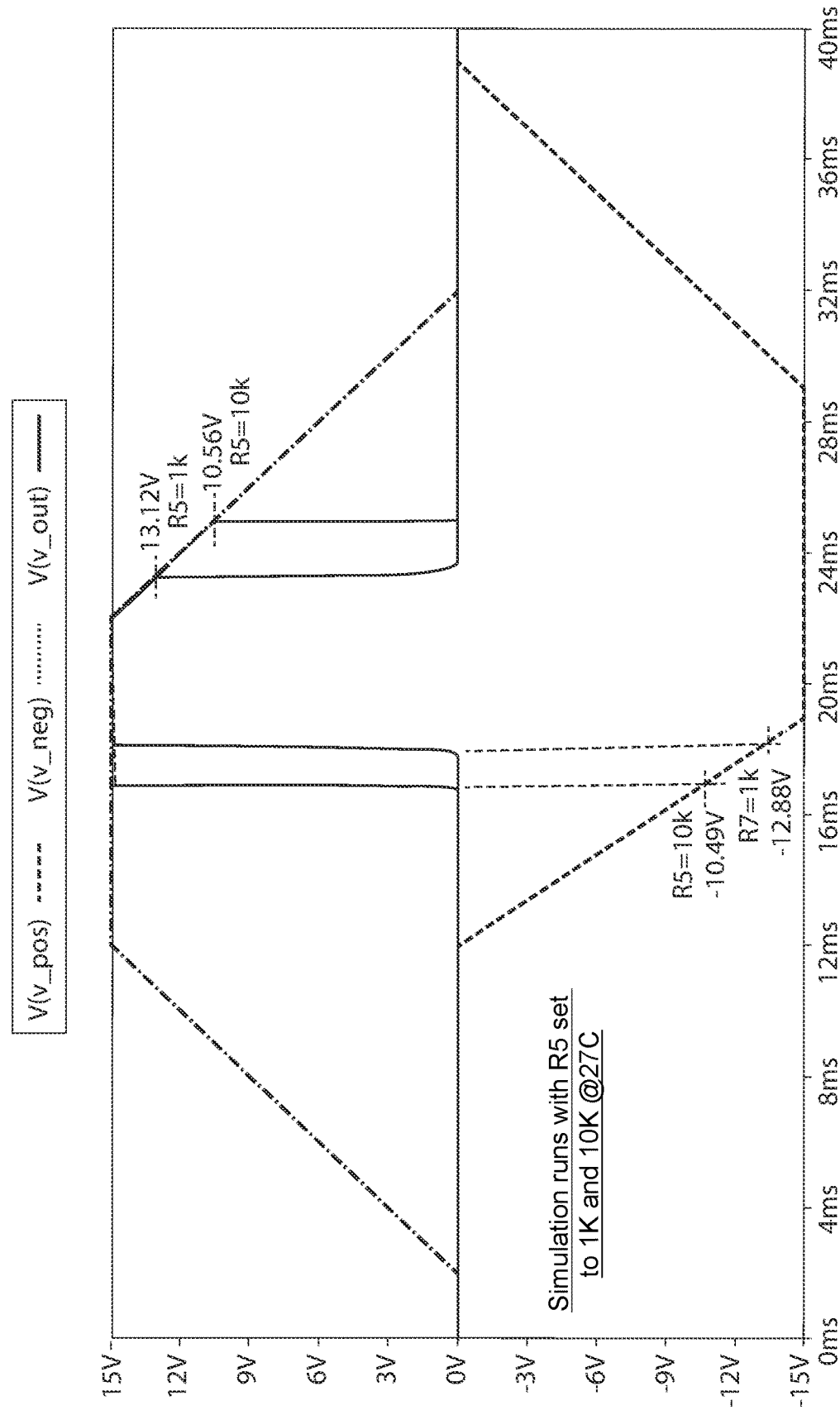
FIG. 7 is a plot shown operation of the embodiment of FIG. 3B, except shown having R5 set to 1K ohms and 10K ohms for comparison (simulated at a temperature of 27 C)
Figure 8:
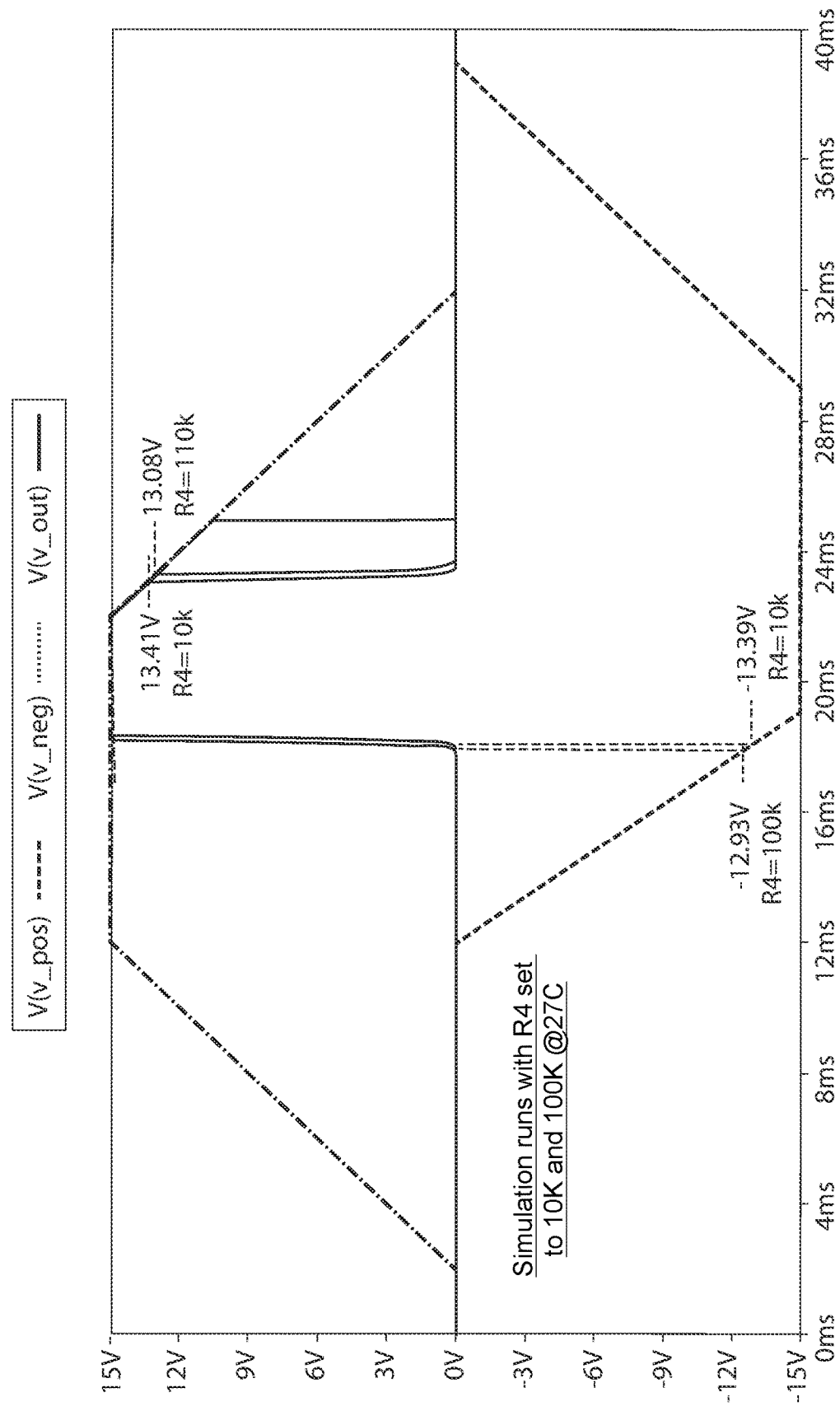
FIG. 8 is a plot shown operation of the embodiments of FIG. 3B, except shown having were R4 set to 10K ohms and 100K ohms for comparison (simulated at a temperature of 27 C).

Referring to FIG. 6, a simulation is shown using a time-staggered ramps for a positive 15 VDC rail and a negative 15 VDC rail to demonstrate that the output signal goes high only when both rails are past a certain level. This plot is a comparison having the R7 value set to 5K in one simulation and 20K in another simulation while temperature is held constant (to show the effect of only changing the R7 value). Referring to FIG. 7, a similar simulation is shown with R5 set to 1K and 10K and temperature being held constant (to show the effect of changing the R5 value). Referring to FIG. 8, a similar simulation is shown with R4 set to 10K and 100K and temperature being held constant (to show the effect of changing the R4 value).

Embodiments can produce an output signal to indicate that both a negative voltage rail, and a positive voltage rail are in a useful range. If either rail has insufficient amplitude, the output signal can be zero volts. Embodiments can use only three bipolar transistors and a small amount of other basic components while operating over a wide temperature range. Accordingly, such embodiments with such few components can be very small and lightweight.

Embodiments can be an effective means to provide Built-In-Test (BIT), and other functions. For example, embodiments can be utilized to tell when a positive 15 VDC rail and a negative 15 VDC rail (e.g., in an aircraft electrical system) have achieved a specified level. Embodiments can be up-scaled or down-scaled to accommodate a range of rail voltages by changing the two Zener voltages and/or adjusting resistor values.

Compared to integrated circuit equivalents, embodiments can be very simple circuits using very few parts (e.g., 12 or less components as shown) that can have high Mean Time Between Failures (MTBF), can be less susceptible to Single Event Upsets, can be less susceptible to Electro-Magnetic Interference (EMI), and can be less susceptible to lightning, for example. Embodiments can utilize very common components are available from many vendors (no single-source problems or obsolescence). Embodiment can provide a robust method to provide an indication for when two bipolar power supply voltages are both within a certain voltage band.

Embodiments can be used to monitor a positive voltage supply, and a negative voltage supply (for example the common +15 VDC, and −15 VDC supplies in many aerospace assemblies). When both power supplies are within a certain acceptable band of voltages, the invention will provide a logic output indication.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:
1. A voltage differential testing circuit, comprising:
 a first positive line configured to connect to a positive voltage source;
 a first negative line configured to connect to a negative voltage source; and a plurality of components arranged and configured to output an output voltage when a voltage differential between a positive voltage line and a negative voltage line is within a voltage range, wherein the plurality of components include a Darlington pair transistor assembly having a first transistor (Q1) and a second transistor (Q2) arranged in a Darlington pair configuration, wherein a first base of the first transistor is connected to the first positive line, wherein a second base of the second transistor is connected to a first emitter of the first transistor, wherein a first collector of the first transistor and a second collector of the second transistor are connected to in parallel to a second positive line, wherein a second emitter of the second transistor is connected to the first negative line.

2. The circuit of claim 1, wherein the positive voltage line is connected to a +15 VDC rail, wherein the negative voltage leg is connected to a −15 VDC rail, wherein the plurality of components are configured to output the output voltage when the differential between the positive voltage line and the negative voltage line is 25 VDC or greater in a temperature operating range of −55 C to 125 C.

3. The circuit of claim 1, wherein the plurality of components include a third transistor (Q3) having a third base connected in parallel to the collectors of the first and second transistors, wherein a third emitter of the third transistor is connected to a third positive line, wherein a third collector of the third transistor is connected to a voltage out line.

4. The circuit of claim 3, wherein the first and second transistors are npn transistors, wherein third transistor is a pnp transistor.

5. The circuit of claim 4, wherein the plurality of components include:
a first emitter resistor having a first resistance (R1) and connected between the first emitter and the first negative line such that the first emitter resistor is connected in parallel with the second base to the first emitter and in parallel with the second emitter to the negative line;
a negative line resistor having a negative line resistance (R2) and disposed on the first negative line between a first emitter resistor point where the first emitter resistor connects and the negative voltage source;
a third resistor having a third resistance (R3) and disposed between the first base of the first transistor and a point between the first emitter and the first emitter resistor;
a ground resistor having a fourth resistance (R4) disposed between the third collector and ground, and in parallel to the third collector with the voltage out line;
a second positive line resistor having a fifth resistance (R5) and disposed on the second positive line before a first collector point connecting the second positive line to the first collector;
a first positive line resistor having a positive line resistance (R9) and disposed on the first positive line between the first base and the positive voltage source, wherein a third resistor point where the third resistor connects to the first positive line is between the first positive line resistor and the first base; and
a crossover resistor having a crossover resistance (R7) and disposed between the first positive line and the first negative line, wherein the crossover resistor is electrically connected to a positive crossover point that is between the third resistor point and the first positive line resistor, wherein the crossover resistor is electrically connected to the negative line at a negative crossover point that is between the negative line resistor and the first resistor point.

6. The circuit of claim 5, wherein the plurality of components include a first Zener diode disposed on the negative line between the negative line resistor and the negative voltage source, and a second Zener diode disposed on the first positive line between the first positive line resistor and the positive voltage source, wherein the first and second Zener diodes are oriented and configured to allow respective current flow on each line above a breakdown voltage.

7. The circuit of claim 5, wherein the second positive line and the third positive line are connected to the first positive line or to the positive voltage source to have the same voltage.

8. The circuit of claim 5, wherein R4 is the highest resistance, R7 is lower than R4, R3 is lower than R7, R2 and R9 are lower than R3, and R1 and R5 are lower than R2 and R9.

9. The circuit of claim 8, wherein R4 is 100 k ohms, R7 is 70 k ohms, R3 is 10 k ohms, R2 and R9 are 4K ohms, and R1 and R5 are about 1 k ohms.

10. The circuit of claim 4, wherein the plurality of components include:
a negative line resistor having a negative line resistance (R2) and disposed on the first negative line between the second emitter and the negative voltage source;
a ground resistor having a fourth resistance (R4) disposed between the third collector and ground, and in parallel to the third collector with the voltage out line;
a second positive line resistor having a fifth resistance (R5) and disposed on the second positive line before a first collector point connecting the second positive line to the first collector;
a first positive line resistor having a positive line resistance (R9) and disposed on the first positive line between the first base and the positive voltage source; and
a crossover resistor having a crossover resistance (R7) and disposed between the first positive line and the first negative line, wherein the crossover resistor is electrically connected to a positive crossover point that is between the first base and the first positive line resistor, wherein the crossover resistor is electrically connected to the negative line at a negative crossover point that is between the negative line resistor and the second emitter.

11. The circuit of claim 10, wherein the plurality of components include a first Zener diode disposed on the negative line between the negative line resistor and the negative voltage source, and a second Zener diode disposed on the first positive line between the first positive line resistor and the positive voltage source, wherein the first and second Zener diodes are oriented and configured to allow respective current flow on each line above a breakdown voltage.

12. The circuit of claim 10, wherein the second positive line and the third positive line are connected to the first positive line or to the positive voltage source to have the same voltage.

13. The circuit of claim 10, wherein R4 is the highest resistance, R7 is lower than R4, R2 and R9 are lower than R7, and R5 is lower than R2 and R9.

14. The circuit of claim 10, wherein R7 is between 10 k and 1 megaohm.

15. A voltage differential testing circuit, comprising:
a first positive line configured to connect to a positive voltage source;
a first negative line configured to connect to a negative voltage source; and a plurality of components arranged and configured to output an output voltage when a voltage differential between a positive voltage line and a negative voltage line is within a voltage range, wherein the positive voltage line is connected to a +15 VDC rail, wherein the negative voltage leg is connected to a −15 VDC rail, wherein the plurality of components are configured to output the output voltage when the differential between the positive voltage line and the negative voltage line is 25 VDC or greater in a temperature operating range of −55 C to 125 C.

* * * * *